US012754674B2

(12) United States Patent
Peng et al.

(10) Patent No.: US 12,754,674 B2
(45) Date of Patent: Oct. 6, 2026

(54) MANAGING READ TIMING IN SEMICONDUCTOR DEVICES

(71) Applicant: Macronix International Co., Ltd., Hsinchu (TW)

(72) Inventors: Wu-Chin Peng, Hsinchu (TW); Ken-Hui Chen, Hsinchu (TW); Chun-Hsiung Hung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 236 days.

(21) Appl. No.: 18/524,337

(22) Filed: Nov. 30, 2023

(65) Prior Publication Data

US 2024/0311014 A1 Sep. 19, 2024

Related U.S. Application Data

(60) Provisional application No. 63/451,648, filed on Mar. 13, 2023.

(51) Int. Cl.

| | |
|---|---|
| ***G06F 3/06*** | (2006.01) |
| ***G11C 16/26*** | (2006.01) |
| ***G11C 16/32*** | (2006.01) |

(52) U.S. Cl.

CPC .......... *G06F 3/0613* (2013.01); *G06F 3/0659* (2013.01); *G06F 3/0679* (2013.01); *G11C 16/26* (2013.01); *G11C 16/32* (2013.01)

(58) Field of Classification Search

CPC .... G06F 3/0613; G06F 3/0659; G06F 3/0679; G11C 16/26; G11C 16/32

See application file for complete search history.

(56) References Cited

U.S. PATENT DOCUMENTS

| | | | |
|---|---|---|---|
| 8,432,716 | B2 | 4/2013 | Miura et al. |
| 10,031,699 | B1 | 7/2018 | Graniello et al. |

(Continued)

FOREIGN PATENT DOCUMENTS

| | | |
|---|---|---|
| JP | 2013-235642 | 11/2013 |
| JP | 2020-086517 | 6/2020 |

(Continued)

OTHER PUBLICATIONS

Lee Seok-han. A Stacked Memory Architecture for Improving Performance and Capacity. Diss. Seoul National University Graduate School, 2019. (Year: 2019).*

(Continued)

*Primary Examiner* — Nicholas J Simonetti

(74) *Attorney, Agent, or Firm* — Fish & Richardson P.C.

(57) ABSTRACT

Systems, devices, methods, and circuits for managing read timing in semiconductor devices are provided. In one aspect, a semiconductor device includes: a memory array configured to store data and a circuitry coupled to the memory array and configured to read stored data from the memory array. The circuitry is configured to: obtain a starting address of target data to be read based on a read instruction, determine that the starting address is in a first address group of a plurality of address groups, each of the plurality of address groups being associated with a respective reading speed, and read out the target data from the memory array based on the starting address being in the first address group.

20 Claims, 9 Drawing Sheets

(56) References Cited

U.S. PATENT DOCUMENTS

| | | | | |
|---|---|---|---|---|
| 2010/0169540 | A1* | 7/2010 | Sinclair | G06F 12/0246<br>711/E12.008 |
| 2010/0223426 | A1* | 9/2010 | Perego | G06F 12/04<br>711/E12.007 |
| 2010/0327923 | A1* | 12/2010 | Pyeon | G06F 13/1689<br>327/145 |
| 2013/0297987 | A1 | 11/2013 | Gupta et al. | |
| 2016/0124873 | A1* | 5/2016 | Xu | G06F 3/0613<br>711/167 |
| 2018/0032429 | A1* | 2/2018 | Liu | G06F 12/0871 |
| 2018/0174656 | A1 | 6/2018 | Chih et al. | |
| 2019/0107947 | A1* | 4/2019 | Kojima | G06F 3/0656 |
| 2020/0264792 | A1* | 8/2020 | Paley | G06F 3/0679 |
| 2022/0092004 | A1* | 3/2022 | Intrater | G06F 3/0634 |
| 2022/0157388 | A1 | 5/2022 | Kwak | |
| 2022/0236914 | A1* | 7/2022 | Kim | G11C 11/5628 |
| 2022/0317925 | A1* | 10/2022 | Lepak | G06F 3/0659 |
| 2023/0170005 | A1 | 6/2023 | Tanzawa | |
| 2024/0086107 | A1* | 3/2024 | Nayak | G06F 3/0679 |

FOREIGN PATENT DOCUMENTS

| | | | |
|---|---|---|---|
| TW | 202046115 | A | 12/2020 |
| TW | 202105189 | A | 2/2021 |
| TW | 202123015 | A | 6/2021 |
| WO | WO 2021/172170 | | 2/2021 |

OTHER PUBLICATIONS

Yang, Jun, et al. “A double sensing scheme with selective bitline voltage regulation for ultralow-voltage timing speculative SRAM.” IEEE Journal of Solid-State Circuits 53.8 (2018): 2415-2426. (Year: 2018).*

* cited by examiner

MANAGING READ TIMING IN SEMICONDUCTOR DEVICES

CROSS-REFERENCE TO RELATED APPLICATION

This application claims priority under 35 USC § 119(c) to U.S. Provisional Patent Application Ser. No. 63/451,648, entitled "READ TIMING DESIGN SCHEME" and filed on Mar. 13, 2023, the entire content of which is hereby incorporated by reference.

TECHNICAL FIELD

The present disclosure is directed to semiconductor devices, e.g., read timing in semiconductor devices.

BACKGROUND

Semiconductor devices, e.g., memory devices, are becoming smaller and faster. Many applications request to support higher read frequencies. However, to ensure successful read, a read control timing setting has to be aligned with a worst read performance, which can suppress using a higher read frequency for a higher read performance.

SUMMARY

The present disclosure describes methods, devices, systems and techniques for managing read timing in semiconductor devices, e.g., non-volatile memory devices such as flash memory devices.

One aspect of the present disclosure features a semiconductor device including: a memory array configured to store data and a circuitry coupled to the memory array and configured to read stored data from the memory array. The circuitry is configured to: obtain a starting address of target data to be read based on a read instruction; determine that the starting address is in a first address group of a plurality of address groups, each of the plurality of address groups being associated with a respective reading speed; and read out the target data from the memory array based on the starting address being in the first address group.

In some implementations, each of the plurality of address groups is associated with a respective timing profile of a plurality of timing profiles that are different from each other. The circuitry is configured to: determine a first timing profile associated with the first address group; and read out the target data from the memory array according to the first timing profile.

In some implementations, different timing profiles are associated with different reading speeds. The first timing profile is associated with a first reading speed, and a second timing profile of the plurality of timing profiles is associated with a second reading speed that is higher than the first reading speed.

In some implementations, a timing profile includes at least one of: a time duration of activating a word line, a time duration of activating a bit line, a time duration of sensing one or more data bits from the memory array, or a time duration of outputting the one or more data bits.

In some implementations, the target data includes a first part and a second part sequential to the first part, the first part having the starting address. The circuitry is configured to read out the first part with a first reading speed and the second part with a second reading speed that is higher than the first reading speed.

In some implementations, a total length of the first part of the target data is predetermined.

In some implementations, the circuitry is configured to receive a clock signal having a clock frequency and read out the target data using the clock signal.

In some implementations, the first address group includes a collection of particular addresses corresponding to a slower reading speed than addresses in one or more other address groups. One or more addresses of the particular addresses correspond to one or more particular memory cells coupled to one or more last data bits of a word line of the memory array.

In some implementations, the particular addresses in the first address group are fixed or predetermined.

In some implementations, the circuitry is configured to determine time durations for the particular addresses in the first address group based on one or more parameters comprising a clock frequency and a data density of a word line.

In some implementations, the circuitry includes a memory interface coupled to the memory array. The memory interface is configured to: receive an input signal for reading the target data from the memory array, the input signal comprising the read instruction; and output an output signal comprising the read out target data.

In some implementations, the circuitry includes an address detector coupled to the memory interface and configured to obtain the starting address of the target data based on the input signal and determine that the starting address is in the first address group.

In some implementations, the circuitry further includes a timing profile controller coupled to the address detector and configured to determine a timing profile for reading the target data based on a signal from the address detector, the signal indicating that the starting address of the target data is in the first address group.

In some implementations, the memory interface is configured to output the output signal after one or more dummy cycles following the input signal, and the circuitry is configured to determine which group the starting address is in before the one or more dummy cycles start. The memory interface includes a serial pin configured to perform at least one of: receiving the input signal from a bus, or outputting the output signal to the bus.

In some implementations, the memory interface includes multiple serial input/output (SIO) pins, and the memory interface is configured to receive the input signal from a bus using at least one of the multiple SIO pins and output the output signal to the bus using the multiple SIO pins.

In some implementations, the read instruction includes a read command and the starting address.

Another aspect of the present disclosure features a system including: a memory device and a controller coupled to the memory device and configured to transmit a read instruction to the memory device. The memory device includes: a memory array configured to store data and a circuitry coupled to the memory array and configured to read stored data from the memory array. The circuitry is configured to: obtain a starting address of target data to be read based on the read instruction; determine that the starting address is in a first address group of a plurality of address groups, each of the plurality of address groups being associated with a respective reading speed; read out the target data from the memory array based on the starting address being in the first address group; and output the read out target data to the controller.

In some implementations, the target data includes a first part and a second part sequential to the first part, the first part having the starting address, and the circuitry is configured to read out the first part with a first reading speed and the second part with a second reading speed that is higher than the first reading speed.

Another aspect of the present disclosure features a method including: obtaining a starting address of target data to be read from a memory array, determining that the starting address is in a first address group of a plurality of address groups, each of the plurality of address groups being associated with a respective reading speed, and the first address group is associated with a first reading speed and reading out the target data from the memory array with the first reading speed based on the starting address being in the first address group.

Another aspect of the present disclosure features a semiconductor device, including: a memory array configured to store data; and a circuitry coupled to the memory array and configured to read stored data from the memory array. The circuitry is configured to: obtain a starting address of target data to be read based on a read instruction; determine that the starting address is in a first address group of a plurality of address groups, where each of the plurality of address groups is associated with a respective timing profile of a plurality of timing profiles that are different from each other; determine a first timing profile associated with the first address group; and read out the target data from the memory array according to the first timing profile.

In some implementations, different timing profiles are associated with different reading speeds. The first timing profile is associated with a first reading speed, and a second timing profile of the plurality of timing profiles is associated with a second reading speed that is higher than the first reading speed.

In some implementations, the target data includes a first part and a second part sequential to the first part, the first part having the starting address. The first timing profile includes a first timing sub-profile for the first part of the target data and a second timing sub-profile for the second part of the target data, and the first timing sub-profile corresponds to the first reading speed, and the second timing sub-profile corresponds to the second reading speed.

In some implementations, a total length of the first part of the target data is predetermined, or a total time period of the first timing sub-profile is predetermined.

In some implementations, the circuitry is configured to receive a clock signal having a clock frequency and read out the target data using the clock signal.

In some implementations, a particular time duration in the first timing profile corresponds to a first number of clock cycles of the clock signal, and a corresponding particular time duration in the second timing profile corresponds to a second number of clock cycles of the clock signal.

In some implementations, a time period in the first timing profile is predetermined, and where the circuitry is configured to determine a number of clock cycles for the time period based on the clock frequency.

In some implementations, the first address group includes a collection of particular addresses corresponding to a slower reading speed than addresses in one or more other address groups, and one or more addresses of the particular addresses correspond to one or more particular memory cells coupled to one or more last data bits of a word line of the memory array. In some implementations, the particular addresses in the first address group are fixed.

In some implementations, the circuitry is configured to determine the particular addresses in the first address group and/or time durations for the particular addresses based on one or more parameters including a clock frequency and a data density of a word line.

In some implementations, a timing profile includes at least one of: a time duration of activating a word line, a time duration of activating a bit line, a time duration of sensing one or more data bits from the memory array, or a time duration of outputting the one or more data bits.

In some implementations, the circuitry includes a memory interface coupled to the memory array. The memory interface is configured to: receive an input signal for reading the target data from the memory array, the input signal including the read instruction; and output an output signal including the read out target data.

In some implementations, the circuitry includes an address detector coupled to the memory interface and configured to obtain the starting address of the target data based on the input signal and determine that the starting address is in the first address group.

In some implementations, the circuitry further includes a timing profile controller coupled to the address detector and configured to determine the first timing profile for reading the target data based on a signal from the address detector, the signal indicating that the starting address of the target data is in the first address group.

In some implementations, the circuitry further includes: an output buffer configured to output the read out target data to the memory interface.

In some implementations, the memory interface is configured to output the output signal after one or more dummy cycles following the input signal, and the circuitry is configured to determine which group the starting address is in before the one or more dummy cycles start.

In some implementations, the circuitry is configured to determine which group the starting address is in at an ending clock cycle of receiving the input signal.

In some implementations, a period of the one or more dummy cycles is fixed or determined based on a determination that the starting address is in the first address group.

In some implementations, the one or more dummy cycles happen between an ending cycle of the input signal and a beginning cycle of the output signal.

In some implementations, the memory interface includes a serial pin configured to perform at least one of: receiving the input signal from a bus, or outputting the output signal to the bus.

In some implementations, the memory interface includes multiple serial input/output (SIO) pins configured to receive the input signal from a bus by using at least one of the multiple SIO pins and output the output signal to the bus using the multiple SIO pins. In some implementations, a number of the multiple SIO pins is 2 or 4.

In some implementations, the memory interface is configured to: multiplex the multiple SIO pins to receive the input signal from the bus and to output the output signal to the bus.

In some implementations, the memory interface is configured to: receive the input signal from the bus through the multiple SIO pins; and output the output signal to the bus through the multiple SIO pins.

In some implementations, bits of the starting address are multiplexed on the multiple SIO pins, and bits of the read out target data are multiplexed on the multiple SIO pins.

In some implementations, the read instruction includes a read command and the starting address.

Another aspect of the present disclosure features a system, including: a memory device; and a controller coupled to the memory device and configured to transmit a read instruction to the memory device. The memory device includes: a memory array configured to store data and a circuitry coupled to the memory array and configured to read stored data from the memory array. The circuitry is configured to: obtain a starting address of target data to be read based on the read instruction; determine that the starting address is in a first address group of a plurality of address groups, where each of the plurality of address groups is associated with a respective timing profile of a plurality of timing profiles that are different from each other; determine a first timing profile associated with the first address group; read out the target data from the memory array according to the first timing profile; and output the read out target data to the controller.

A further aspect of the present disclosure features a method, including: obtaining a starting address of target data to be read from a memory array; determining that the starting address is in a first address group of a plurality of address groups, where each of the plurality of address groups is associated with a respective timing profile of a plurality of timing profiles that are different from each other; determining a first timing profile associated with the first address group; and reading out the target data from the memory array according to the first timing profile.

Implementations of the above techniques include methods, systems, circuits, computer program products and computer-readable media. In one example, a method can include the above-described actions. In another example, one such computer program product is suitably embodied in a non-transitory machine-readable medium that stores instructions executable by one or more processors. The instructions are configured to cause the one or more processors to perform the above-described actions. One such computer-readable medium stores instructions that, when executed by one or more processors, are configured to cause the one or more processors to perform the above-described actions.

Note that, in the present disclosure, the term "read frequency" refers to a clock frequency of a clock signal for reading data, e.g., 66 MHz, 100 MHZ, 133 MHz, 160 MHZ, 200 MHz, or more. The term "read frequency" can also refer to as "reading frequency." A read frequency for reading data from a memory device can be specified in a data sheet for the memory device. The data sheet can include one or more read frequencies. In some examples, the data sheet includes a lower read frequency and a higher read frequency. A user can choose to operate a read operation using either the lower read frequency or the higher read frequency.

In the present disclosure, the term "read speed" indicates how fast data is read, which is inversely related to a time duration (or a time period) of reading the data. The time duration can be based on a read frequency of a clock signal and a number of clock cycles for reading the data. The term "read speed" can also refer to as "reading speed."

In the present disclosure, the term "timing profile" refers to a profile of time durations for different actions associated with a read operation. In some examples, the timing profile includes at least one of: a time duration of activating a word line, a time duration of activating a bit line, a time duration of sensing one or more data bits from the memory array, or a time duration of outputting the one or more data bits. Each time duration can be defined by a respective number of clock cycles or a respective time period.

The details of one or more disclosed implementations are set forth in the accompanying drawings and the description below. Other features, aspects, and advantages will become apparent from the description, the drawings and the claims.

BRIEF DESCRIPTION OF THE DRAWINGS

Like reference numbers and designations in the various drawings indicate like elements. It is also to be understood that the various exemplary implementations shown in the figures are merely illustrative representations and are not necessarily drawn to scale.

DETAILED DESCRIPTION

Figure 1:
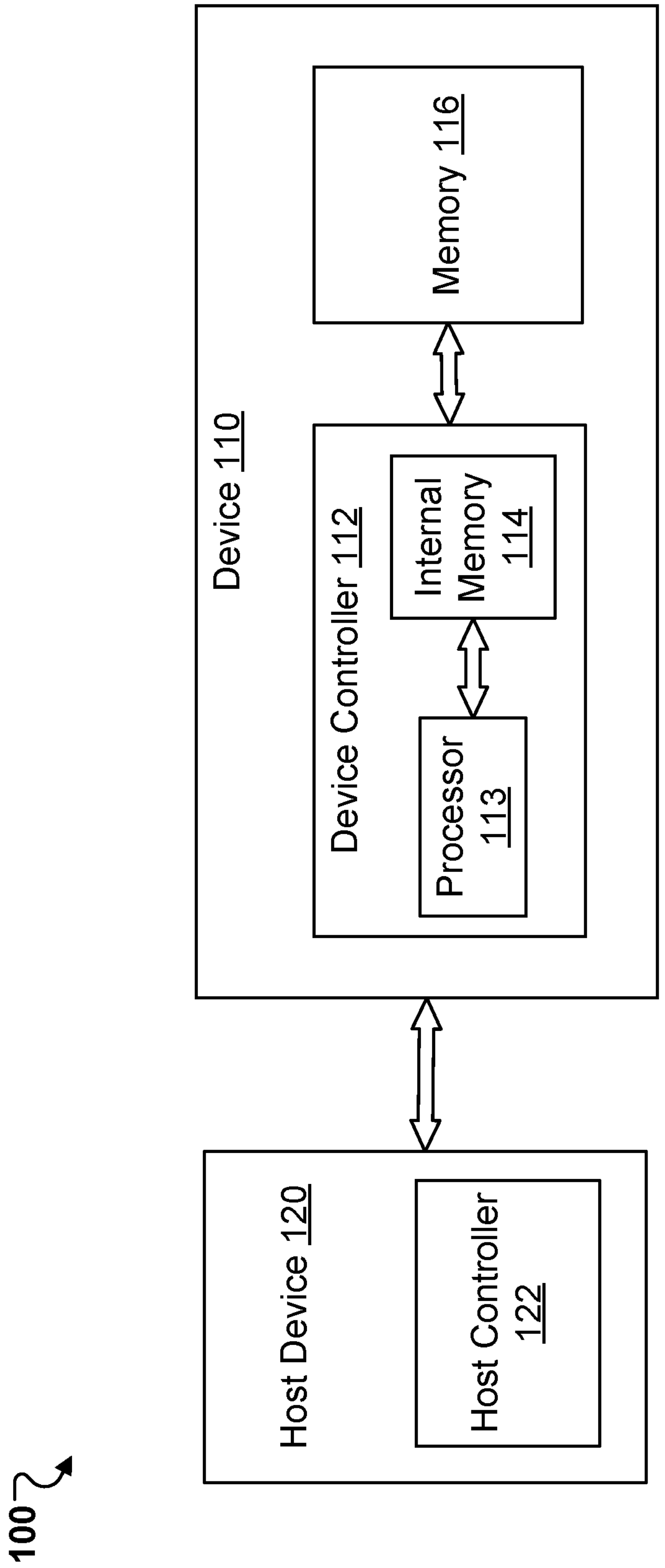
FIG. 1 is a schematic diagram illustrating an example of a system, according to one or more embodiments of the present disclosure.

Implementations of the present disclosure provide techniques for managing read timing in semiconductor devices, e.g., non-volatile memory devices such as NOR flash memory devices. The techniques can ensure successful read in the semiconductor devices, without aligning read control timing settings in the semiconductor devices to a worst read performance (e.g., reading data starting at an end of a word line with a lowest read frequency). Instead, the techniques enable the semiconductor devices to detect starting read addresses of data and reconfigure corresponding read control timing settings for reading the data to support a higher read frequency to achieve a higher read performance, which can avoid issues where unrestricted starting read addresses suppress higher read frequency and performance.

For example, if the starting read address is detected to be in a worse read region of a semiconductor device, the techniques enable the semiconductor device to first read a beginning part of data with a lower read speed and then switch to a higher read speed for a remaining part of the data, without consistently keeping at the lower read speed. Moreover, if the starting read address is detected to be in a read region that is out of one or more worse read regions, the techniques enable the semiconductor device to read data, e.g., the entirety of the data, consistently using the higher read speed, which achieves a higher read performance.

The techniques enable to achieve a high read performance with simple and cost-effective configurations. In some implementations, the semiconductor device includes an address detector (or an address detection circuit) configured to detect a starting address of data to be read from a memory array, e.g., based on a read instruction. The address detector can determine whether or not the starting address is within a first group (e.g., a group including worst read regions) in the semiconductor device. If the starting address is determined to be within the first group, the address detector transmits a first corresponding signal indicating that the starting address is within the first group to a timing profile controller that can be coupled to, e.g., through a state machine, a sense amplifier coupled to the memory array. The timing profile controller can store different timing profiles associated with different groups of read regions. The timing profile controller can configure a first corresponding timing profile (with a lower read speed) for the first group based on the first corresponding signal and transmit the first corresponding timing profile to the sense amplifier that reads the data according to the first corresponding timing profile. Similarly, if the starting address is determined to be within a second group (e.g., including regions other than the worst read regions), the address detector can also transmit a second corresponding signal for the second group to the timing profile controller. The timing profile controller can also configure a second corresponding timing profile (e.g., with a higher read speed) for the second group and transmit the second corresponding timing profile to the sense amplifier that reads the data according to the second corresponding timing profile.

The techniques can be applied to various interfaces or protocols, e.g., Serial Peripheral Interfaces ("SPIs") such as single-bit SPI or multi-bit SPI, or Quad Peripheral Interface ("QPI"). The techniques can be applied to external and/or internal clock designs. The techniques can be applied to various applications that use high read frequency and/or high read performance, e.g., True Wireless Stereo (TWS) System on Chip (SoC), Application-Specific Integrated Circuits (ASICs), and/or Field Programmable Gate Arrays (FPGAs). The techniques can be applied to various types of semiconductor devices, e.g., non-volatile memory devices such as NOR flash memory devices, NAND flash memory devices, resistive random-access memory (RRAM) devices, phase-change random-access memory (PCRAM) devices, among others. The techniques can be applied to various memory types, such as SLC (single-level cell) devices, MLC (multi-level cell) devices like 2-level cell devices, TLC (triple-level cell) devices, QLC (quad-level cell) devices, or PLC (penta-level cell) devices. Additionally or alternatively, the techniques can be applied to various types of devices and systems, such as secure digital (SD) cards, embedded multimedia cards (eMMC), or solid-state drives (SSDs), embedded systems, among others. For illustration purposes, in the present disclosure, a memory device is described as an example of a semiconductor device.

FIG. 1 illustrates an example of a system 100. The system 100 includes a device 110 and a host device 120. The device 110 includes a device controller 112 and a memory 116. The device controller 112 includes a processor 113 and an internal memory 114. In some implementations, the device 110 includes a plurality of memories 116 that are coupled to the device controller 112. The memory 116 includes a plurality of blocks. The memory 116 can be a two-dimensional (2D) memory including 2D memory blocks. The memory 116 can also be a three-dimensional (3D) memory including 3D memory blocks. The memory 116 can be a semiconductor device and formed on a semiconductor substrate (e.g., a silicon wafer).

The host device 120 includes a host controller 122 that can include at least one processor and at least one memory coupled to the at least one processor and storing programming instructions for execution by the at least one processor to perform one or more corresponding operations.

In some implementations, the device 110 is a storage device. For example, the device 110 can be an embedded multimedia card (eMMC), a secure digital (SD) card, a solid-state drive (SSD), or some other suitable storage. In some implementations, the device 110 is a smart watch, a digital camera or a media player. In some implementations, the device 110 is a client device that is coupled to a host device 120. For example, the device 110 is an SD card in a digital camera or a media player that is the host device 120.

The device controller 112 is a general-purpose microprocessor, or an application-specific microcontroller. In some implementations, the device controller 112 is a memory controller for the device 110. The following sections describe the various techniques based on implementations in which the device controller 112 is a memory controller. However, the techniques described in the following sections are also applicable in implementations in which the device controller 112 is another type of controller that is different from a memory controller.

The processor 113 is configured to execute instructions and process data. The instructions include firmware instructions and/or other program instructions that are stored as firmware code and/or other program code, respectively, in the secondary memory. The data includes program data corresponding to the firmware and/or other programs executed by the processor, among other suitable data. In some implementations, the processor 113 is a general-purpose microprocessor, or an application-specific microcontroller.

The processor 113 accesses instructions and data from the internal memory 114. In some implementations, the internal memory 114 is a Static Random Access Memory (SRAM) or a Dynamic Random Access Memory (DRAM). For example, in some implementations, when the device 110 is an eMMC, an SD card or a smart watch, the internal memory 114 is an SRAM. In some implementations, when the device 110 is a digital camera or a media player, the internal memory 114 is DRAM.

In some implementations, the internal memory is a cache memory that is included in the device controller 112, as shown in FIG. 1. The internal memory 114 stores instruction codes, which correspond to the instructions executed by the processor 113, and/or the data that are requested by the processor 113 during runtime. The device controller 112 transfers the instruction code and/or the data from the memory 116 to the internal memory 114.

In some implementations, the memory 116 is a non-volatile memory that is configured for long-term storage of instructions and/or data, e.g., an NOR or NAND flash memory device, or some other suitable non-volatile memory device. The memory 116 can include one or more memory chips. In implementations where the memory 116 is an NAND flash memory, the device 110 is a flash memory device, e.g., a flash memory card, and the device controller 112 is an NAND flash controller. For example, in some implementations, when the device 110 is an eMMC or an SD card, the memory 116 is an NAND flash memory; in some implementations, when the device 110 is a digital camera, the memory 116 is an SD card; and in some implementations, when the device 110 is a media player, the memory 116 is a hard disk. In some implementations where the memory 116 is an NOR flash memory, the device 110 can optionally include the device controller 112. In some cases, the device 110 can include no device controller and the memory 116 can directly communicate with the host device 120.

In some implementations, a system includes a controller and a semiconductor device. The controller can be coupled to the semiconductor device via an electrical connection, e.g., an electrical wire, pin or bus, or a wireless connection, and communicates, e.g., directly, with the semiconductor device. The controller can be the host controller 122 of FIG. 1 or the device controller 112 of FIG. 1. The semiconductor device can be implemented as the memory 116 of FIG. 1. The semiconductor device can be also a memory device 200 as described with further details in FIG. 2.

Figure 2:
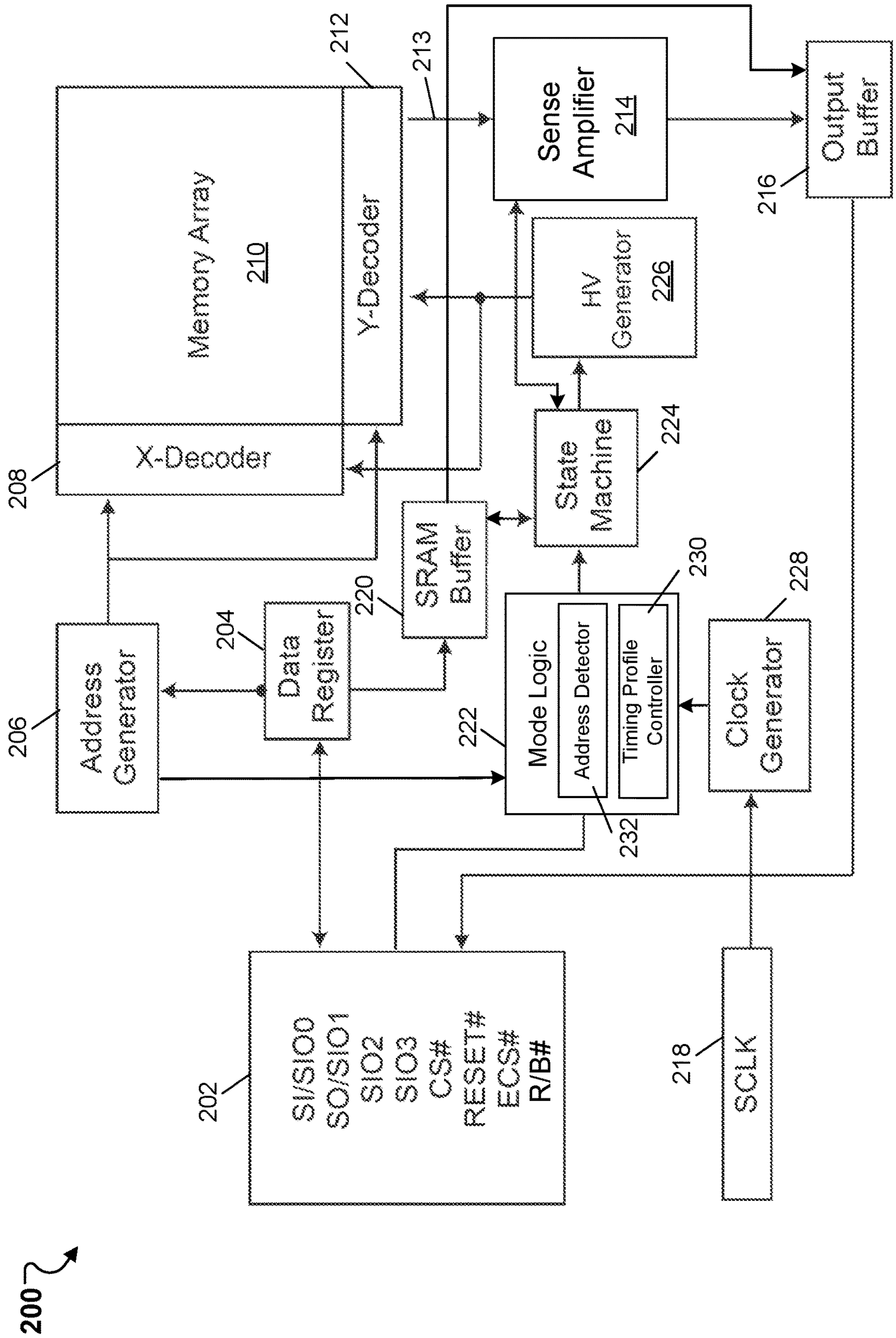
FIG. 2 is a schematic diagram illustrating an example of a memory device, according to one or more embodiments of the present disclosure.

FIG. 2 is a schematic diagram illustrating an example of a memory device 200, according to one or more embodiments of the present disclosure. The memory device 200 can be implemented as the memory 116 of FIG. 1.

As illustrated in FIG. 2, the memory device 200 includes a number of components that can be integrated onto a board, e.g., a Si-based carrier board, and be packaged. The memory device 200 can have a memory array 210 that can include a number of memory cells. The memory cells can be coupled in series to a number of row word lines and a number of column bit lines. Each memory cell can include a memory transistor configured as a storage element (e.g., a capacitor) to store data. The memory transistor can include a silicon-oxide-nitride-oxide-silicon (SONOS) transistor, a floating gate transistor, a nitride read only memory (NROM) transistor, or any suitable non-volatile memory MOS device that can store charges.

The memory device 200 can include an X-decoder (or row decoder) 208 and optionally a Y-decoder (or column decoder) 212. Each memory cell can be coupled to the X-decoder 208 via a respective word line and coupled to the Y-decoder 212 via a respective bit line. Accordingly, each memory cell can be selected by the X-decoder 208 and the Y-decoder 212 for read or write operations through the respective word line and the respective bit line.

The memory device 200 can include a memory interface (including input/output—I/O) 202 having multiple pins configured to be coupled to an external device, e.g., the device controller 112 and/or the host device 120 of FIG. 1. The pins can include SI/SIO0 for serial data input/serial data input & output, SO/SIO1 for serial data output/serial data input & output, SIO2 for serial data input or output, SIO3 for serial data input or output, RESET# for hardware reset pin active low, CS# for chip select, and ECS# for ECC correction signal, and R/B# pin for indicating a ready or busy status of the memory device 200. ECS is abbreviation of Error Correction Code (ECC) Correction Signal. The memory interface 202 can also include one or more other pins, e.g., WP# for write protection active low, and/or Hold# for a holding signal input.

In some implementations, the memory device 200 includes a data register 204, an SRAM buffer 220, an address generator 206, a synchronous clock (SCLK) input 218, a clock generator 228, a mode logic 222, a state machine 224, and a high voltage (HV) generator 226.

The SCLK input 218 can be configured to receive a SCLK signal (e.g., a clock signal with a clock frequency) and the clock generator 228 can be configured to generate a corresponding clock signal for the memory device 200 based on the synchronous clock input. The corresponding clock signal can have a clock frequency (or clock bit rate) same as the SCLK signal. The clock frequency can be used by the memory device 200 as a read frequency for performing a read operation or a write frequency for performing a write operation. The clock frequency can be, e.g., 66 MHZ, 100 MHZ, 133 MHZ, 160 MHz, 200 MHz, or more. The clock frequency can be specified in a data sheet of the memory device 200. As discussed in the present disclosure, for the memory device 200, the data sheet can include one or more read frequencies. In some examples, the data sheet includes a lower read frequency and a higher read frequency. A user can choose either the lower read frequency or the higher read frequency for operations of the memory device 200, e.g., based on characteristics of read regions storing target data. Data can be sampled or transmitted in single data rate (SDR) or double data rate (DDR). In some examples, if a clock frequency is 100 MHz, data can be transmitted at 50 MHz for SDR or 100 MHz for DDR.

The mode logic 222 can be configured to determine whether there is a read or write operation and provide a result of the determination to the state machine 224. The memory device 200 can also include a sense amplifier 214 that can be optionally connected to the Y-decoder 212 by a data line 213 and an output buffer 216 for buffering an output signal from the sense amplifier 214 to the memory interface 202. The sense amplifier 214 can be part of read circuitry that is used when data is read from the memory device 200. The sense amplifier 214 can be configured to sense low power signals from a bit line that represents a data bit (1 or 0) stored in a memory cell and to amplify small voltage swings to recognizable logic levels so the data can be interpreted properly. The sense amplifier 214 can also communicate with the state machine 224, e.g., bidirectionally.

A controller, e.g., the host controller 122 or the device controller 112 of FIG. 1, can generate commands, such as read commands and/or write commands that can be executed respectively to read data from and/or write data to the memory device 200. Data being written to or read from the memory array 210 can be communicated or transmitted between the memory device 200 and the controller and/or other components via a data bus (e.g., a system bus), which can be a multi-bit bus. As discussed with further details in FIGS. 5-8, a communication protocol between the controller and the memory device 200 can be a SPI protocol or a QPI protocol.

In some implementations, during a read operation, the memory device 200 receives a read command (or a read instruction) from the controller through the memory interface 202, e.g., according to a SPI protocol or a QPI protocol. The read instruction can be transmitted using SDR or DDR. The state machine 224 can provide control signals to the HV generator 226 and the sense amplifier 214. The sense amplifier 214 can also send information, e.g., sensed logic levels of data, back to the state machine 224. The HV generator 226 can provide a voltage to the X-decoder 208 and the Y-decoder 212 for selecting a memory cell. The sense amplifier 214 can sense a small power (voltage or current) signal from a bit line that represents a data bit (1 or 0) stored in the selected memory cell and amplify the small power signal swing to recognizable logic levels so the data bit can be interpreted properly by logic outside the memory device 200. The output buffer 216 can receive the amplified voltage from the sense amplifier 214 and output the amplified power signal to the logic outside the memory device 200 through the memory interface 202.

Data can be read out from a read region ranging from a starting address to an ending address. The read region can cover multiple sequential word lines. For example, as discussed with details in FIG. 4, a timing profile for reading data can include: a time duration of activating a word line, a time duration of activating a bit line, a time duration of sensing one or more data bits from a memory array, and a time duration of outputting the one or more data bits. If the starting address is at an end of a first word line, e.g., at one or more last bits of the first word line, after finishing reading the one or more last bits of the first word line, the memory device 200 has to first activate a second, sequential word line and a corresponding bit line before reading data bits of the second word line. As it takes time to activate the second word line and the corresponding bit line, the memory device cannot use a high read speed from the starting address at the first word line to data bits at the second word line. Otherwise, it may cause read errors. Instead, the memory device has to use a low read speed from the starting address at the first word line to the second word line.

A read region with a starting address at an end of a word line can be considered as a worse read region. There may be one or more other worse read regions where the memory device has to use a corresponding low read speed or low read frequency. In some cases, to ensure successful read, a read speed or read frequency of the memory device has to be aligned with the lowest read speed or read frequency for the worst read region in the memory device, which can affect the read performance of the memory device.

As discussed above and below with further details, implementations of the present disclosure provide techniques enabling a memory device to detect a starting read address of data and configure a corresponding read control timing setting for reading the data to support a higher read frequency to achieve a higher read performance.

For example, if the starting read address is detected to be in a worst read region of a memory device, the memory device can first read a beginning part of data with a lower read speed and then switch to a higher read speed for a remaining part of the data, without consistently keeping at the lower read speed. If the starting read address is detected to be in a read region that is out of one or more worst read regions, the memory device can read data, e.g., the entirety of the data, consistently using the higher read speed, which achieves a high read performance.

In some implementations, e.g., as illustrated in FIG. 2, the memory device 200 includes an address detector 232 (or an address detection circuit). In some implementations, as illustrated in FIG. 2, the address detector 232 is included in the mode logic 222. The address detector 232 can perform one or more operations/actions according to the clock signal, e.g., from the clock generator 228. In some implementations, the address detector 232 is external to the mode logic 222. The address detector 232 can include one or more logic circuits or logic gates.

The address detector 232 can be configured to detect a starting address of data to be read from the memory array 210, e.g., based on a read instruction. For example, e.g., as illustrated in FIG. 5, 6, 7, or 8, the read instruction can include a command and a starting address of data, e.g., right after the command. The address detector 232 can receive the read instruction from the memory interface 202. The address detector 232 can determine whether or not the starting address is within one or more worst read regions in the memory device 200. In some implementations, the memory device 200 characterizes or stores worst read regions in a first group, e.g., Group A, and regions other than the worst read regions in a second group, e.g., Group B.

As noted above, a worst read region can be defined as last data bits of a word line, e.g., a predetermined number of last data bits at an end of the word line (e.g., 3 data bits, 5 data bits, 10 data bits or more) or a predetermined percentage of data bits at the end of the word line (e.g., 1%, 5%, 10%, or more). The worst read regions can be predetermined in the memory device, or dynamically determined based on one or more parameters, e.g., a clock frequency (or a read frequency), and/or a data density of the word line or the memory array 210. Information of the worst read region (e.g., an address ranging from a beginning address and an ending address) can be stored in the memory device 200, e.g., in the address detector 232 or the mode logic 222.

The address detector 232 can determine whether the starting address of data to be read is within the worst read region by comparing the starting address with the beginning address and the ending address. If the starting address of the data is larger than (or identical to) the beginning address but smaller than (or identical to) the ending address of the worst read region, the address detector 232 can determine that the starting address is within the worst read region. However, if the starting address of the data is smaller than the beginning address of each of the one or more worst read regions in the first group or larger than the ending address of each of the one or more worst read regions in the first group, the address detector 232 can determine that the staring address of the data is out of the first group and/or in the second group.

In some implementations, the memory device 200 includes a timing profile controller 230 that can store different timing profiles associated with different groups of read regions and the associations between the different timing profiles and the different groups of read regions. The timing profile controller 230 can include one or more registers or buffers storing the timing profiles and one or more logics and/or circuits for managing the timing profiles. In some implementations, the timing profile controller 230 is included in the mode logic 222, e.g., as illustrated in FIG. 2. The timing profile controller 230 can be coupled to the address detector 232. In some implementations, the timing profile controller 230 is included in the address detector 232. In some implementations, the timing profile controller 230 is included in the sense amplifier 214.

The timing profile controller 230 (e.g., the one or more logics and/or circuits) can be configured to determine which timing profile is for which group of read regions based on a signal indicating that the starting address is within which group of read regions from the address detector 232 and the timing profiles stored in the one or more registers or buffers. In some implementations, the timing profile controller 230 generates a particular timing profile for a particular group of read regions or a particular read region.

If the starting address is determined to be within the first group, the address detector 232 can transmit a first corresponding signal indicating that the starting address is within the first group to the timing profile controller 230 that is coupled to the sense amplifier 214 coupled to the memory array 210. The timing profile controller 230 can configure a first corresponding timing profile (with a lower read speed) for the first group based on the first corresponding signal. The timing profile controller 230 can transmit the first corresponding timing profile to the sense amplifier 214 that can read the data according to the first corresponding timing profile. In some implementations, the timing profile controller 230 transmits the first corresponding timing profile to the state machine 224, and the state machine 224 further transmits the first corresponding timing profile to the sense amplifier 214. Similarly, if the starting address is determined to be within a second group (e.g., including regions other than the worst read regions), the address detector 232 can also transmit a second corresponding signal for the second group to the timing profile controller 230. The timing profile controller 230 can also configure a second corresponding timing profile (e.g., with a higher read speed) for the second group, and the timing profile controller 230 can transmit the second corresponding timing profile to the sense amplifier 214 that can read the data according to the second corresponding timing profile.

In some implementations, e.g., as illustrated in FIG. 2, the mode logic 222 includes both the address detector 232 and the timing profile controller 230. The mode logic 222 can be coupled to the address generator 206, the clock generator 228, and the state machine 224. The sense amplifier 214 can be controlled by the state machine 224 or the mode logic 222 (e.g., through the state machine 224). In some implementations, address information of data (e.g., date to be read from the memory array 210) received from the memory interface 202 is stored in the address generator 206. Then the address generator 206 can transmit the address information of the data to the address detector 232 (e.g., in the mode logic 222). The address detector 232 can determine a starting address of the data based on the address information and can further determine whether the staring address of the data is the first group or in the second group. After the address detector 232 determines a group the starting address of the data is in, the address detector 232 can transmit the information to the timing profile controller 230 that can determine which timing profile is for the group and for reading the data. The timing profile controller 230 can then send the timing profile to the sense amplifier 214, and the sense amplifier can then use the timing profile to read the data from the memory array 210.

In some implementations, the address detector 232 is external to the mode logic 222 and is coupled to the address generator 206 and to the timing profile controller 230. In some implementations, the timing profile controller 230 is external to the mode logic 222 and can be coupled to the address detector 232 and to the sense amplifier 214, e.g., directly or through the state machine 224.

Figure 3:
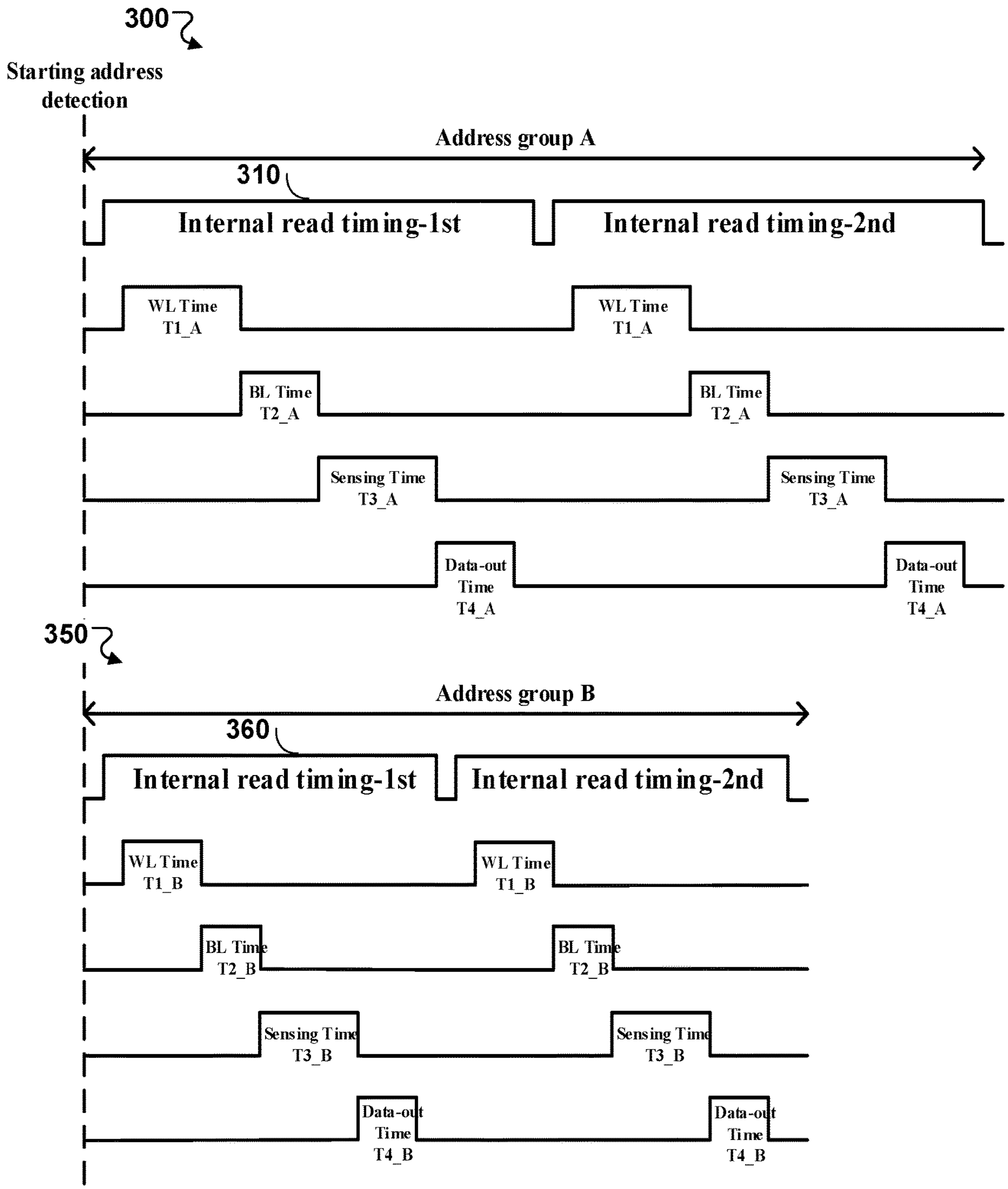
FIG. 3 is a schematic diagram illustrating two different example timing profiles, according to one or more embodiments of the present disclosure.

FIG. 3 is a schematic diagram illustrating two different example timing profiles, according to one or more embodiments of the present disclosure. For illustration purposes, address group A corresponds to the first group as noted above that includes one or more worst read regions, and address group B corresponds to the second group as noted above that include regions other than the one or more worst read regions. The timing profile controller 230 can store or configure different timing profiles for these two groups, e.g., a first timing profile 300 for address group A and a second timing profile 350 for address group B.

As illustrated in FIG. 3, a timing profile includes multiple internal read timing periods. Each period can include a series of time durations for reading a data bit (or one or more data bits in parallel), e.g., a time duration of activating a word line (e.g., WL Time), a time duration of activating a bit line (e.g., BL Time), a time duration of sensing the data bit from the memory array (e.g., Sensing Time), and a time duration of outputting the data bit (e.g., Data-out Time). As the address group A includes the one or more worst read regions, a read speed for read regions in address Group A is slower or smaller than a read speed for read regions in address Group B, and accordingly, a time duration for address Group A can be longer than a corresponding time duration for address Group B.

For example, e.g., as shown in FIG. 3, for WL time, T1_A for address group A is longer than T1_B for address group B; for BL time, T2_A for address group A is longer than T2_B for address group B; for Sensing time, T3_A for address group A is longer than T3_B for address group B; for Data-out time, T4_A for address group A is longer than T4_B for address group B. Thus, an internal read timing period 310 of the first timing profile 300 includes T1_A, T2_A, T3_A, and T4_A, while an internal read timing period 360 of the second timing profile 350 includes T1_B, T2_B, T3_B, and T4_B. The internal read timing period 360 is shorter (or smaller) than the internal read timing period 310, which indicates a faster read speed for the internal read timing period 360 than for the internal read timing period 310.

In some implementations, each time duration in a timing profile is defined by a number of clock cycles of a clock signal having a clock frequency. That is, an actual time period of the time duration is identical to a multiplication of the number of clock cycles and a period of a clock cycle (e.g., an inverse of the clock frequency). In some implementations, each time duration is defined as an actual time period or a fixed time. Based on a clock frequency of a clock signal, the memory device (e.g., the timing profile controller) can calculate how many clock cycles for each time, e.g., WL time, BL time, Sensing time, and Data-out time.

In some implementations, after reading a beginning part of target data that includes a starting address in a worst read region (e.g., last data bits of a first word line), a memory device can increase a read speed for a remaining part of the target data. The remaining part of the target data can include one or more worst read regions, e.g., last data bits of word lines sequential to the first word line. In some implementations, the timing profile 300 includes a first timing sub-profile for the beginning part of the target data and a second timing sub-profile for the remaining part of the target data. The first timing sub-profile can include one or more internal read timing periods 310, while the second timing sub-profile can include one or more internal read timing periods 360. That is, the target data can be read out with two different read speeds, which can avoid the speed limitation for reading the worst read region, increase the read speed, and improve an overall read performance. In contrast, the second timing profile 350 for address group B includes same internal read timing period 360 for reading an entirety of the target data.

In some implementations, a total length of the beginning part of the target data with a slower read speed can be predetermined, e.g., 10 data bits. In some implementations, a total time period of the first timing sub-profile can be predetermined, e.g., 1 μs. The total length of the beginning part and/or the total time period of the first timing sub-profile can be predetermined or dynamically determined by the memory device or the controller (e.g., the device controller 112 or the host device 122 of FIG. 1) based on one or more parameters (e.g., a clock frequency or a data density).

Figure 4:
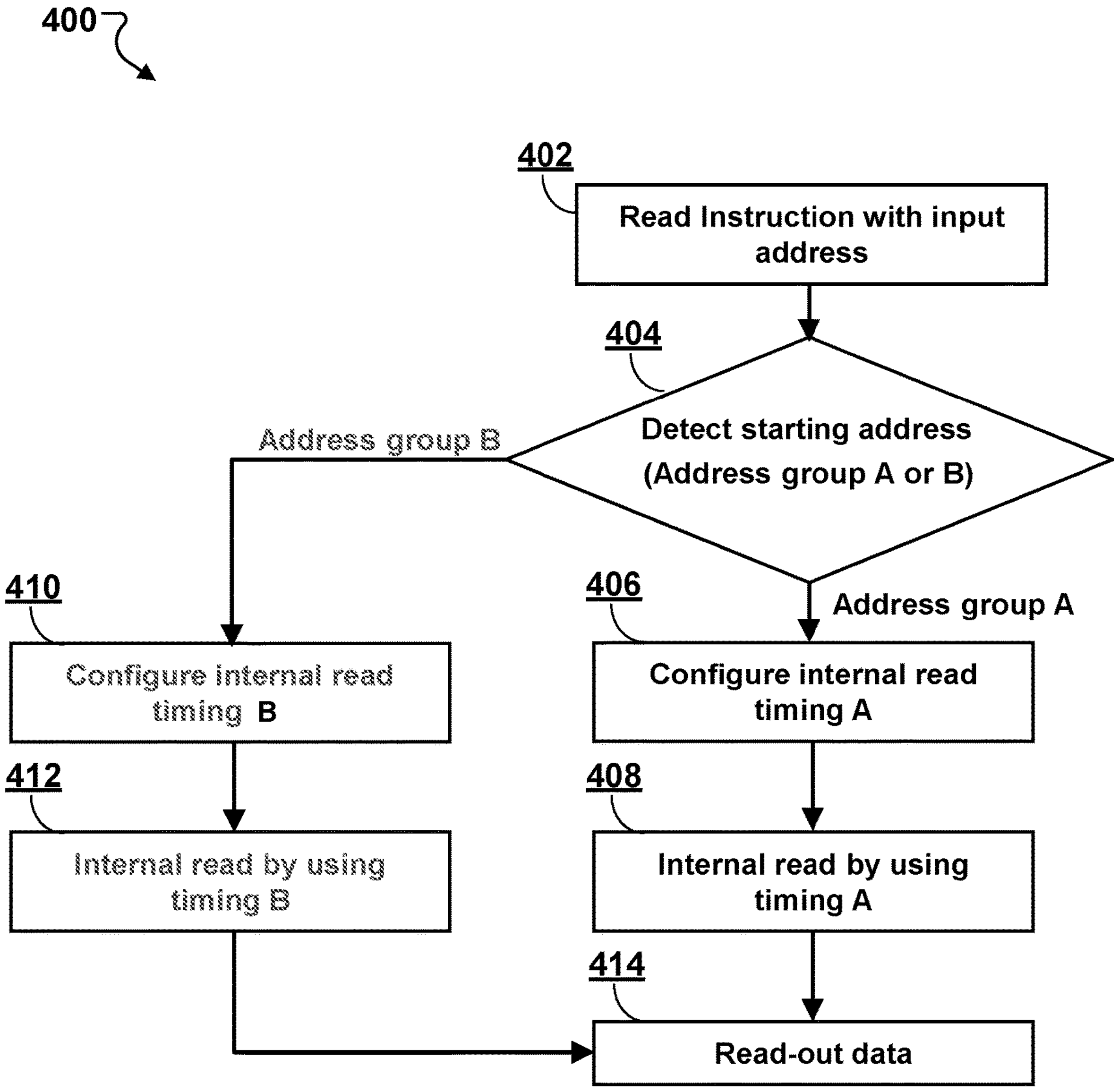
FIG. 4 is a flow chart of an example of a process for managing read timing in a memory device, according to one or more embodiments of the present disclosure.

FIG. 4 is a flow chart of an example of a process 400 for managing read timing in a memory device, according to one or more embodiments of the present disclosure. The memory device can be the memory 116 of FIG. 1 or the memory device 200 of FIG. 2.

At step 402, the memory device receives a read instruction with an input address, e.g., from a controller. The controller can be, e.g., the host controller 122 of FIG. 1 or the device controller 112 of FIG. 1. The controller can be coupled to the memory device and can send the read instruction to the memory device through a memory interface of the memory device (e.g., the memory interface 202 of FIG. 2). The read instruction can include a read command and the input address. The input address can be a starting address of target data to be read from a memory array of the memory device (e.g., the memory array 210 of FIG. 2).

At step 404, the memory device detects whether the starting address of the target data is in address group A or address group B. As discussed above, the address group A can be a group of one or more worst read regions, while the group B can be a group of read regions other than the one or more worst read regions. The memory device can include an address detector (e.g., the address detector 232 of FIG. 2) that can determine whether the starting address of the target data is in address Group A or address Group B.

If the starting address of target data is in address group A, at step 406, the memory device configures internal read timing A (e.g., the timing profile 300 of FIG. 3) for reading the target data. As noted above, the address detector can transmit a signal indicating that the starting address is in address group A to a timing profile controller (e.g., the timing profile controller 230 of FIG. 2). The timing profile controller can configure the internal read timing A for the target data, e.g., by retrieving stored internal read timing A based on an association between the internal read timing A and the address group A. The timing profile controller can transmit the internal read timing A to the sense amplifier. At step 408, the memory device (e.g., the sense amplifier) reads the target data from the memory array according to the internal read timing A. At step 414, the memory device transmits the read-out data, e.g., to the controller through the memory device.

Similarly, if the starting address of target data is in address group B, at step 410, the memory device (e.g., the timing profile controller) configures internal read timing B (e.g., the timing profile 350 of FIG. 3) for reading the target data. The timing profile controller can transmit the internal read timing B to the sense amplifier. At step 412, the memory device (e.g., the sense amplifier) reads the target data from the memory array according to the internal read timing B. At step 414, the memory device transmits the read-out data, e.g., to the controller through the memory device.

As noted above, a memory interface (e.g., the memory interface 202 of FIG. 2) coupled between a memory device (e.g., the memory 116 of FIG. 1 or the memory device 200 of FIG. 2) and a controller (e.g., the host device 120, or the host controller 122, or the device controller 112 of FIG. 1) can be configured according to SPI or QPI protocol, and the memory interface can include one or more serial input (SI), serial output (SO), or serial input/output (SIO) pins (e.g., SI/SIO0, SO/SIO1, SIO2, and SIO3). The techniques implemented in the present disclosure can be applied to different embodiments of the memory interface, e.g., as discussed with further details in FIGS. 5-8.

Figure 5:
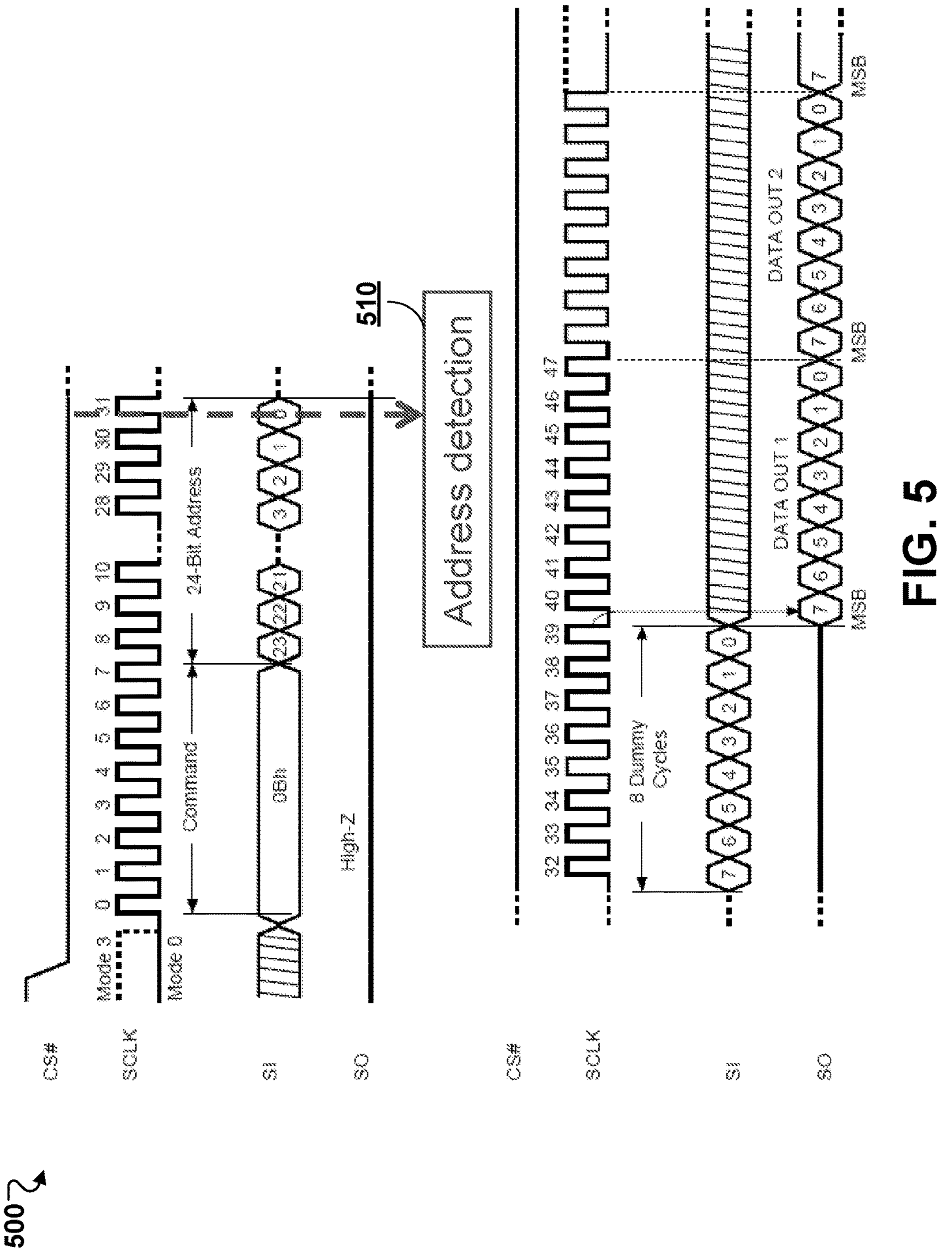
FIG. 5 is a schematic diagram illustrating an example timing diagram with address detection for SPI interface, according to one or more embodiments of the present disclosure.

FIG. 5 is a schematic diagram illustrating an example timing diagram 500 with address detection for SPI interface, according to one or more embodiments of the present disclosure.

As shown in FIG. 5, the memory device is selected for a read operation (e.g., CS# is at a low signal level "0"). The memory device receives an SCLK signal, e.g., from the SCLK input 218 of FIG. 2, that can include a number of clock cycles with a clock frequency. A read instruction can be transmitted onto a bus to the memory device, e.g., from the controller. The read instruction can include a command and an input address (e.g., a starting address). The command (e.g., 0 Bh with 8 bits) can be first transmitted to the memory device through an SI pin, followed by the input address (e.g., 24-bit address). The memory device can perform address detection 510 (e.g., step 404 of FIG. 4) at an end of the input address (e.g., the last bit of the input address such as "0"). The address detection 510 can be performed at a rising edge of a corresponding clock signal (e.g., as illustrated in FIG. 5) or a falling edge of the corresponding clock signal. Following the input address, a number of dummy cycles (e.g., 8 dummy cycles) can be transmitted through the SI pin on the bus. After the dummy cycles, the memory device transmits readout target data to the controller through an SO pin, e.g., at a falling edge of the clock signal. The readout target data can be output as data packets, e.g., data output 1, data output 2, as illustrated in FIG. 5. While the SI pin is selected for data transfer, the SO pin can be kept at high-Z (or high impedance) state.

Figure 6:
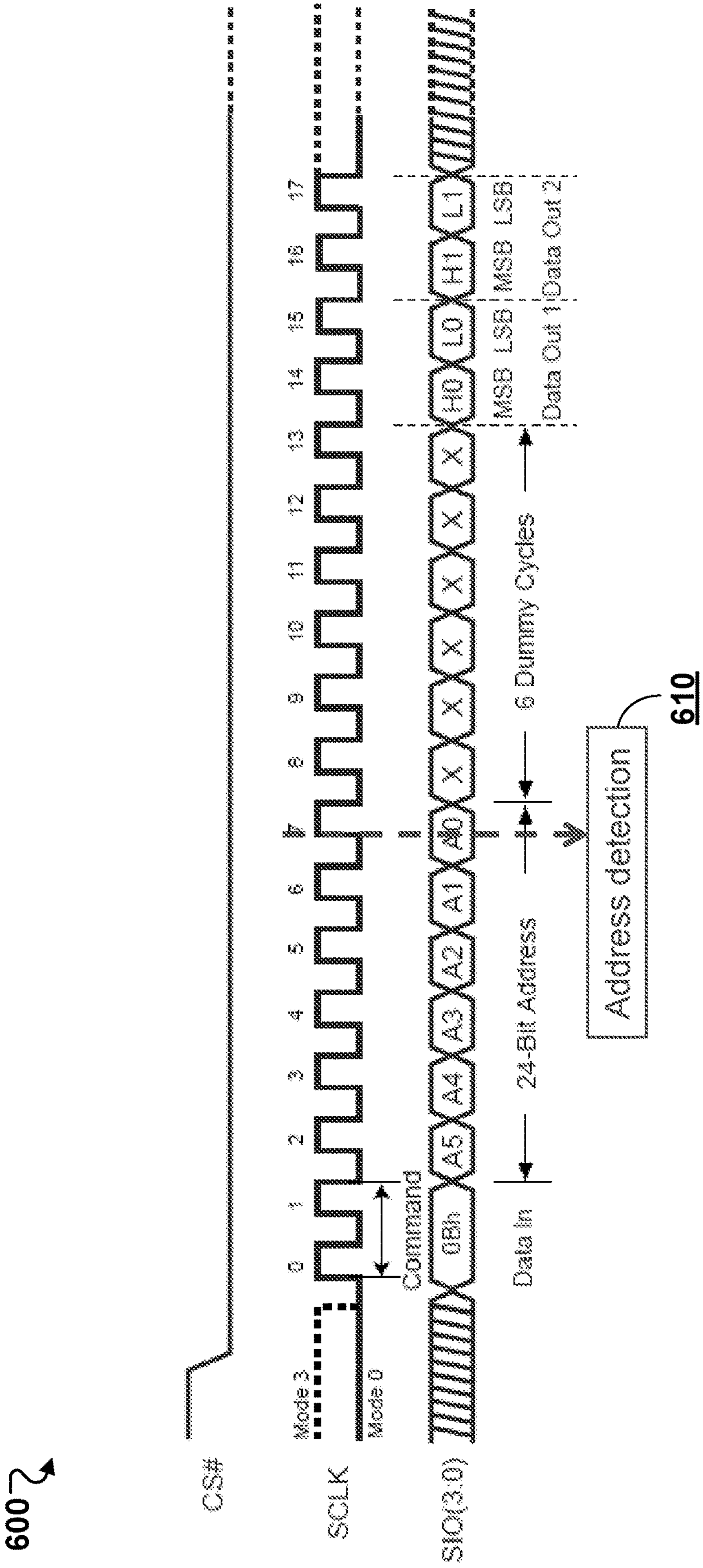
FIG. 6 is a schematic diagram illustrating an example timing diagram with address detection for QPI interface with four SIO pins, according to one or more embodiments of the present disclosure.

FIG. 6 is a schematic diagram illustrating an example timing diagram 600 with address detection for QPI interface with four SIO pins, according to one or more embodiments of the present disclosure.

In the timing diagram 600, a read instruction (e.g., a command with 8-bits and an input address with 24-bits) is first transmitted on a bus by 4 SIO pins (SIO (3:0)). Each SIO pin can be configured to transmit 2-bits of the command and 6-bits of the input address. The memory device performs address detection 610 (e.g., step 404 of FIG. 4) at an end of the input address (e.g., the last bit of the input address such as A0). The address detection 610 can be performed at a rising edge of a corresponding clock signal (e.g., as illustrated in FIG. 6) or a falling edge of the corresponding clock signal. Following the input address, a number of dummy cycles (e.g., 6 dummy cycles) can be transmitted through the SIO pins on the bus. After the dummy cycles, the memory device transmits readout target data to the controller through the SIO pins, e.g., at a falling edge and a rising edge of the clock signal. The readout target data can be output as data packets, e.g., data output 1, data output 2, as illustrated in FIG. 6. Each data packet can include most significant bits (MSBs) or high order bits (e.g., H0 or H1) and least significant bits (LSBs) or lower order bits.

Figure 7:
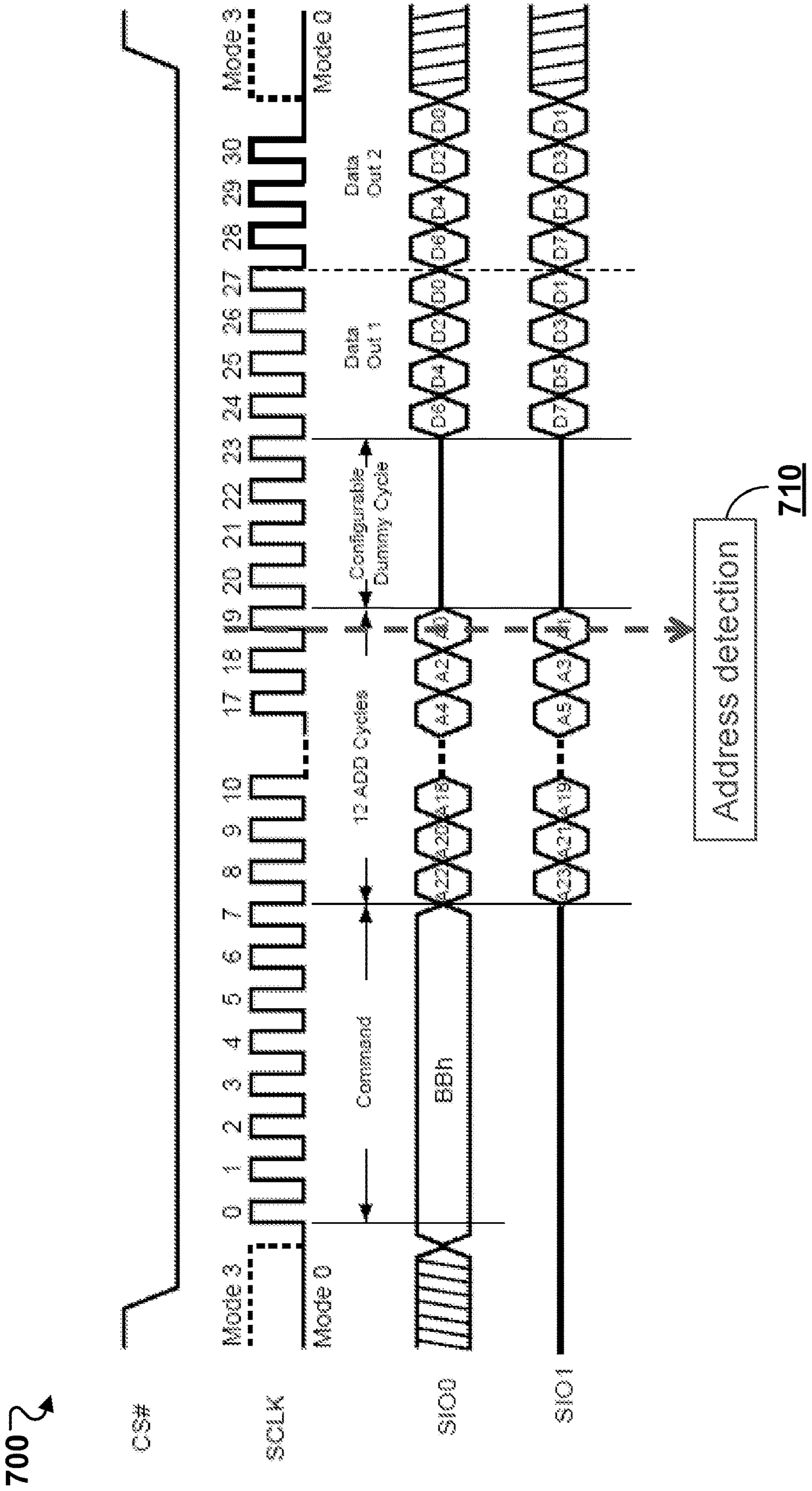
FIG. 7 is a schematic diagram illustrating an example timing diagram with address detection for SPI interface with two SIO pins, according to one or more embodiments of the present disclosure.

FIG. 7 is a schematic diagram illustrating an example timing diagram 700 with address detection for SPI interface with two SIO pins, according to one or more embodiments of the present disclosure.

As illustrated in FIG. 7, a command can be transmitted to the memory device through a SIO pin (e.g., SIO0), while an input address (e.g., 24 bits) can be transmitted through two SIO pins simultaneously (e.g., 12 bits through SIO0 pin and 12 bits through SIO1 pin). The memory device can perform address detection 710 (e.g., step 404 of FIG. 4) at an end of the input address (e.g., the last bit of the input address such as A0, A1). The address detection 710 can be performed at a rising edge of a corresponding clock signal (e.g., as illustrated in FIG. 7) or a falling edge of the corresponding clock signal. Following the input address, a number of dummy cycles can be transmitted on the bus. The number of dummy cycles can be configurable, e.g., by the memory device or the controller. After the dummy cycles, the memory device transmits readout target data to the controller through the two SIO pins simultaneously, e.g., at a falling edge of the clock signal. The readout target data can be output as data packets, e.g., data output 1, data output 2, as illustrated in FIG. 7. For example, 8-bit data can be transmitted by transmitting 4 bits (D0, D2, D4, D6) through SIO0 pin and 4 bits (D1, D3, D5, D7) through SIO1 pin.

Figure 8:
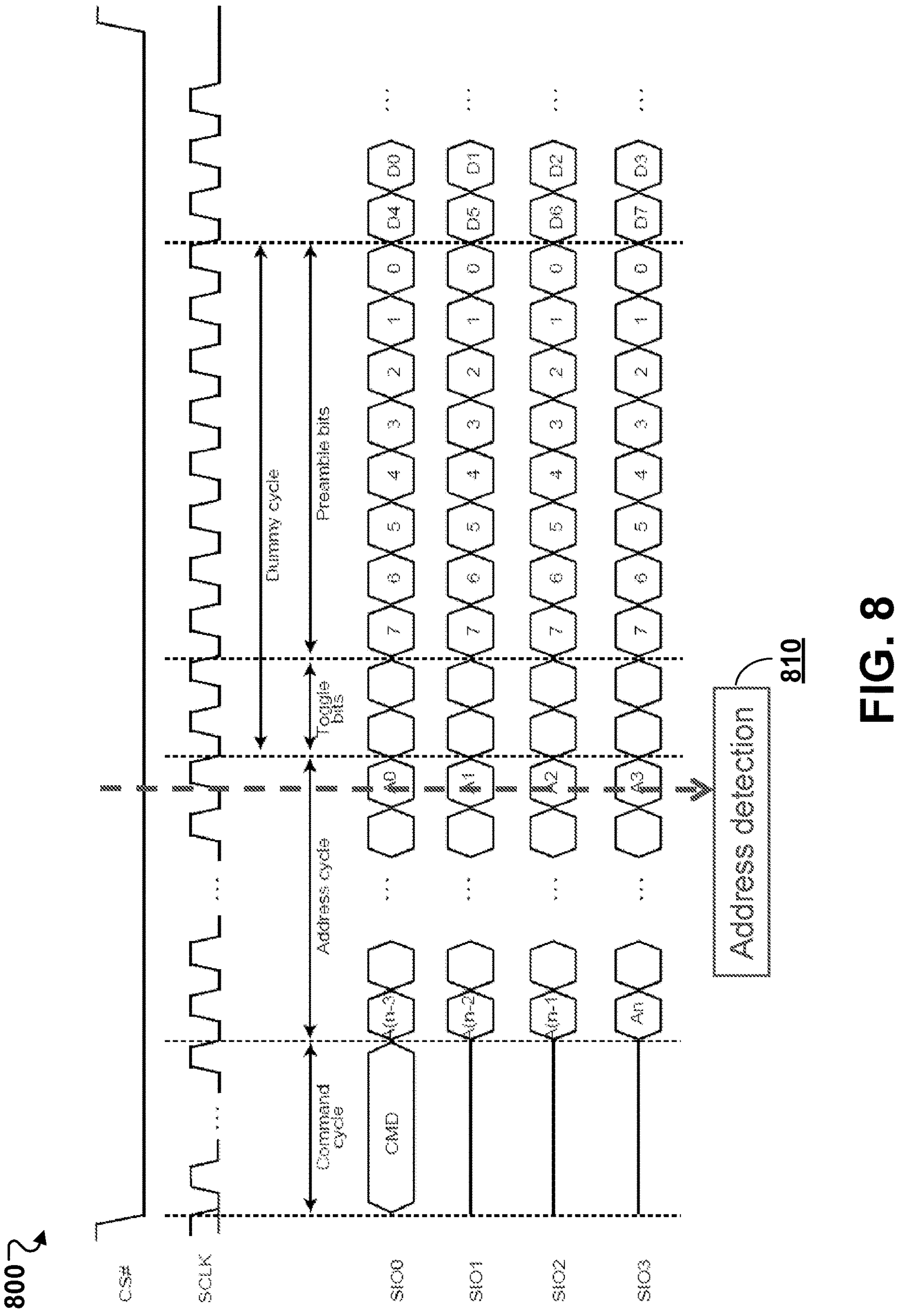
FIG. 8 is a schematic diagram illustrating an example timing diagram with address detection for SPI interface with four SIO pins, according to one or more embodiments of the present disclosure.

FIG. 8 is a schematic diagram illustrating an example timing diagram 800 with address detection for SPI interface with four SIO pins, according to one or more embodiments of the present disclosure.

As illustrated in FIG. 8, a command and an input address can be transmitted to the memory device through four SIO pins (e.g., SIO0, SIO1, SIO2, SIO3) simultaneously. The memory device can perform address detection 810 (e.g., step 404 of FIG. 4) at an end of the input address (e.g., the last bit of the input address such as A0, A1, A2, A3). The address detection 810 can be performed at a rising edge of a corresponding clock signal (e.g., as illustrated in FIG. 8) or a falling edge of the corresponding clock signal. Following the input address, a number of dummy cycles can be transmitted on the bus. The dummy cycles can include toggle bits and preamble bits. The number of dummy cycles can be configurable, e.g., by the memory device or the controller. After the dummy cycles, the memory device transmits readout target data to the controller through the four SIO pins simultaneously, e.g., at a falling edge of the clock signal. The readout target data can be output as data packets.

Figure 9:
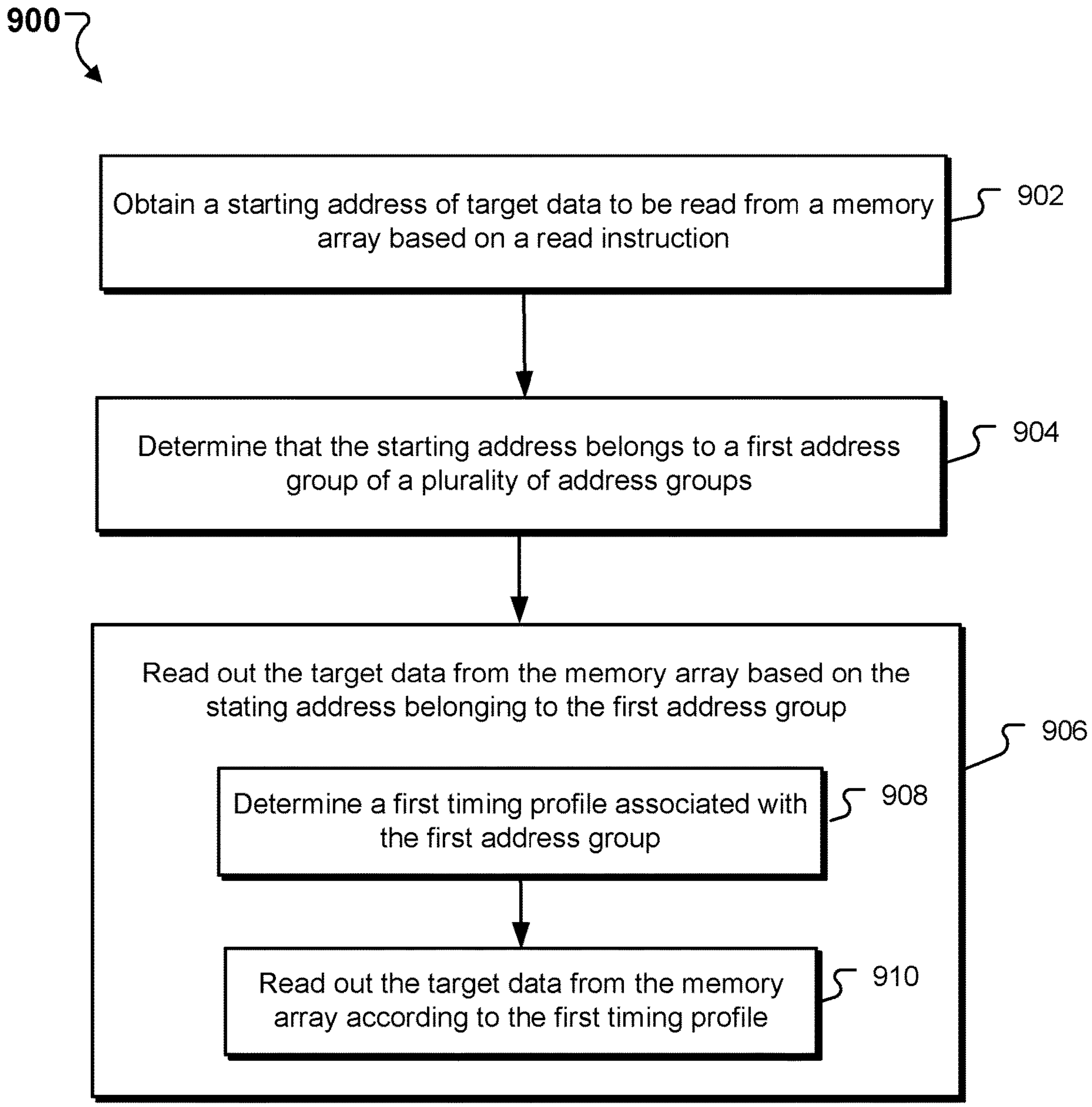
FIG. 9 is a flow chart of an example of a process for managing read timing in a semiconductor device, according to one or more embodiments of the present disclosure.

FIG. 9 is a flow chart of an example of a process 900 for managing read timing in a semiconductor device, according to one or more embodiments of the present disclosure. The semiconductor device can be the memory 116 of FIG. 1 or the memory device 200 of FIG. 2. The semiconductor device can include a memory array (e.g., the memory array 210 of FIG. 2) and a circuitry coupled to the memory array. The memory array can be configured to store data and the circuitry can be configured to read stored data from the memory array. The process 900 can be performed by the semiconductor device such as the circuitry.

The circuitry can be a peripheral circuitry to the memory array. In some embodiments, the circuitry includes at least one of a memory interface (e.g., the memory interface 202 of FIG. 2), an address detector (e.g., the address detector 232 of FIG. 2), a timing profile controller (e.g., the timing profile controller 230 of FIG. 2), or a sense amplifier (e.g., the sense amplifier 214 of FIG. 2). The memory interface can be a Serial Peripheral Interface (SPI) or a Quad Peripheral Interface (QPI). The circuitry can also include one or more other components, e.g., a data register such as the data register 204, a buffer such as the SRAM buffer 220 of FIG. 2 and/or the output buffer 216 of FIG. 2, a mode logic such as the mode logic 222 of FIG. 2, a state machine such as the state machine 224 of FIG. 2, a clock generator such as the clock generator 228 of FIG. 2, a SCLK input such as the SCLK input 218 of FIG. 2, an address generator such as the address generator 206 of FIG. 2, and/or an voltage generator such as the HV generator 226 of FIG. 2.

At step 902, the circuitry obtains a starting address of target data to be read based on a read instruction. The read instruction can include a read command and the starting address, e.g., as illustrated in FIGS. 5-8. A controller, e.g., the host controller 122 of FIG. 1 or the device controller 112 of FIG. 1, can be coupled to the semiconductor device and can send the read instruction to the semiconductor device through the memory interface. The address detector can receive the read instruction from the memory interface.

At step 904, the circuitry determines that the starting address belongs to a first address group of a plurality of address groups. For example, similar to step 404 of FIG. 4, the address detector can determine whether the starting address is within the first address group, e.g., Group A. The first address group can include a collection of particular addresses corresponding to a slower read speed than addresses in one or more other address groups. For example, one or more addresses of the particular addresses correspond to one or more particular memory cells coupled to one or more last data bits of a word line of the memory array. In some embodiments, the particular addresses in the first address group are fixed or predetermined, e.g., last 3 bits, 5 bits, or 10 bits. In some embodiments, the circuitry is configured to determine the particular addresses in the first address group and/or time durations for the particular addresses based on one or more parameters including a clock frequency (e.g., of a clock signal generated by the clock generator) and a data density (e.g., of a word line).

Each of the plurality of address groups is associated with a respective timing profile of a plurality of timing profiles that are different from each other. In some embodiments, e.g., as illustrated in FIG. 3, a timing profile can include at least one of: a time duration of activating a word line, a time duration of activating a bit line, a time duration of sensing one or more data bits from the memory array, or a time duration of outputting the one or more data bits. The timing profiles and/or associations between the timing profiles and the address groups can be stored in the timing profile controller or determined by the timing profile controller. Different timing profiles can be associated with different read speeds, e.g., as illustrated in FIG. 3. The first timing profile can be associated with a first read speed, and a second timing profile can be associated with a second read speed that is higher than the first read speed.

At step 906, the circuitry reads out the target data from the memory array based on the starting address belonging to the first address group. In some implementations, the target data includes a first part and a second part sequential to the first part, the first part having the starting address. A total length of the first part of the target data can be predetermined. The circuitry is configured to read out the first part with the first reading speed and the second part with the second reading speed that is higher than the first reading speed.

In some implementations, at step 908, the circuitry determines a first timing profile associated with the first address group. For example, the address detector can transmit a signal to the timing profile controller, the signal indicating that the starting address of the data belongs to the first address group. The timing profile controller can pre-store the different timing profiles, e.g., the timing profiles of FIG. 3, and select the first timing profile for the first address group based on the association between the first timing profile and the first address group. In some implementations, instead of pre-storing the first timing profile and/or the association between the first timing profile and the first address group, the timing profile controller generates the first timing profile in response to receiving the signal indicating that the starting address of the data belongs to the first address group.

At step 910, the circuitry reads out the target data from the memory array according to the first timing profile, e.g., as described in step 414 of FIG. 4. In some implementations, the target data includes a first part and a second part sequential to the first part, the first part having the starting address. The first timing profile can include a first timing sub-profile for the first part of the target data and a second timing sub-profile for the second part of the target data, and the first timing sub-profile corresponds to the first read speed, and the second timing sub-profile corresponds to the second read speed that is different from the first read speed. A total length of the first part of the target data can be predetermined, and/or a total time period of the first timing sub-profile can be predetermined.

In some implementations, the circuitry is configured to receive a clock signal having a clock frequency, e.g., from the SCLK input 218 of FIG. 2, and read out the target data using the clock signal. The clock frequency can be a read frequency. A particular time duration in the first timing profile can correspond to a first number of clock cycles of the clock signal, and a corresponding particular time duration in the second timing profile can correspond to a second number of clock cycles of the clock signal. The second read speed can be different from the first read speed. In some implementations, a time duration in the first timing profile is predetermined, and the circuitry is configured to determine a number of clock cycles for the time duration based on the clock frequency.

In some implementations, the memory interface of the circuitry is configured to: receive an input signal for reading the target data from the memory array and transmit the input signal to the address detector, the input signal including the read instruction, e.g., as illustrated in FIG. 2, 5, 6, 7, or 8. The memory interface can be also configured to receive the read out target data from the circuitry (e.g., the output buffer 216 of FIG. 2) and output an output signal including the read out target data, e.g., as illustrated in FIG. 2, 5, 6, 7, or 8.

The address detector can be coupled to the memory interface and configured to obtain the starting address of the target data based on the input signal and determine that the starting address belongs to the first address group. The timing profile controller can be configured to store the plurality of timing profiles and be coupled to the address detector and configured to determine the first timing profile for reading the target data based on a signal from the address detector, the signal indicating that the starting address of the target data belongs to the first address group. The circuitry can further include an output buffer (e.g., the output buffer 216 of FIG. 2) configured to output the read out target data to the memory interface.

In some implementations, the memory interface is configured to output the output signal after one or more dummy cycles following the input signal. The circuitry can be configured to determine which group the starting address belongs to before the one or more dummy cycles start and/or at an ending clock cycle of receiving the input signal, e.g., as illustrated in FIG. 5, 6, 7, or 8. A period of the one or more dummy cycles can be fixed or determined based on a determination that the starting address belongs to the first address group. The one or more dummy cycles can happen between an ending cycle of the input signal and a beginning cycle of the output signal. The period of the one or more dummy cycles can be determined by the controller or by the semiconductor device.

In some implementations, the memory interface includes a serial pin configured to perform at least one of receiving the input signal from a bus or outputting the output signal to the bus. In some implementations, the memory interface includes multiple serial input/output (SIO) pins configured to receive the input signal from a bus by using at least one of the multiple SIO pins and output the output signal to the bus using the multiple SIO pins. A number of the multiple SIO pins can be 2 or 4, e.g., as illustrated in FIG. 6, 7, or 8. The memory interface can be configured to: multiplex the multiple SIO pins to receive the input signal from the bus and to output the output signal to the bus, e.g., as illustrated in FIG. 6, where each SIO pin can receive a read command and one or more corresponding addresses. The memory interface can be configured to: receive the input signal from the bus through the multiple SIO pins and output the output signal to the bus through the multiple SIO pins, e.g., as illustrated in FIG. 7 or 8, where one of the multiple SIO pins can receive a read command and one or more addresses, and the other SIO pins can receive (e.g., only) other addresses. Bits of the starting address can be multiplexed on the multiple SIO pins, and bits of the read out target data can be multiplexed on the multiple SIO pins, e.g., as illustrated in FIG. 7 or 8.

The disclosed and other examples can be implemented as one or more computer program products, for example, one or more modules of computer program instructions encoded on a computer readable medium for execution by, or to control the operation of, data processing apparatus. The computer readable medium can be a machine-readable storage device, a machine-readable storage substrate, a memory device, or a combination of one or more them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A system may encompass all apparatus, devices, and machines for processing data, including by way of example a programmable processor, a computer, or multiple processors or computers. A system can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed for execution on one computer or on multiple computers that are located at one site or distributed across multiple sites and interconnected by a communications network.

The processes and logic flows described in this document can be performed by one or more programmable processors executing one or more computer programs to perform the functions described herein. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer can include a processor for performing instructions and one or more memory devices for storing instructions and data. Generally, a computer can also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data can include all forms of nonvolatile memory, media and memory devices, including by way of example semiconductor memory devices, e.g., EPROM, EEPROM, and flash memory devices; magnetic disks. The processor and the memory can be supplemented by, or incorporated in, special purpose logic circuitry.

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

The invention claimed is:

1. A semiconductor device, comprising:

a memory cell array comprising a plurality of memory cells configured to store data; and a circuitry coupled to the memory cell array and configured to read stored data from the memory cell array, wherein the circuitry comprises a timing profile controller and a sense amplifier, wherein the circuitry is configured to:

obtain a starting address of target data to be read from the memory cell array based on a read instruction;

determine that the starting address is in a first address group of a plurality of address groups, wherein each of the plurality of address groups is associated with a respective reading speed, and wherein the plurality of address groups correspond to one or more read regions of the memory cell array;

configure, by the timing profile controller, a first timing profile for the first address group, the first timing profile being associated with a first reading speed for the first address group; and receive, by the sense amplifier, the first timing profile transmitted from the timing profile controller, and read out, by the sense amplifier, the target data from the memory cell array according to the first timing profile that is configured based on the starting address being in the first address group.

2. The semiconductor device of claim 1, wherein each of the plurality of address groups is associated with a respective timing profile of a plurality of timing profiles that are different from each other, and wherein the circuitry is configured to:

determine the first timing profile associated with the first address group; and read out the target data from the memory cell array according to the first timing profile.

3. The semiconductor device of claim 2, wherein different timing profiles are associated with different reading speeds, wherein the first timing profile is associated with the first reading speed, and wherein a second timing profile of the plurality of timing profiles is associated with a second reading speed that is higher than the first reading speed.

4. The semiconductor device of claim 2, wherein a timing profile of the plurality of timing profiles comprises at least one of:

a time duration of activating a word line, a time duration of activating a bit line, a time duration of sensing one or more data bits from the memory cell array, or a time duration of outputting the one or more data bits.

5. The semiconductor device of claim 1, wherein the target data comprises a first part and a second part sequential to the first part, the first part having the starting address, and wherein the circuitry is configured to read out the first part with the first reading speed and the second part with a second reading speed that is higher than the first reading speed.

6. The semiconductor device of claim 5, wherein a total length of the first part of the target data is predetermined.

7. The semiconductor device of claim 1, wherein the circuitry is configured to receive a clock signal having a clock frequency and read out the target data using the clock signal.

8. The semiconductor device of claim 1, wherein the first address group comprises a collection of particular addresses corresponding to a slower reading speed than addresses in one or more other address groups, and wherein one or more addresses of the particular addresses correspond to one or more particular memory cells coupled to an end of a word line of the memory cell array.

9. The semiconductor device of claim 8, wherein the particular addresses in the first address group are fixed or predetermined.

10. The semiconductor device of claim 8, wherein the circuitry is configured to determine at least one of the particular addresses in the first address group or time durations for the particular addresses based on one or more parameters comprising a clock frequency and a data density of the word line.

11. The semiconductor device of claim 1, wherein the circuitry comprises a memory interface coupled to the memory cell array, and wherein the memory interface is configured to:

receive an input signal for reading the target data from the memory cell array, the input signal comprising the read instruction; and output an output signal comprising the read out target data.

12. The semiconductor device of claim 11, wherein the circuitry comprises an address detector coupled to the memory interface and configured to obtain the starting address of the target data based on the input signal and determine that the starting address is in the first address group.

13. The semiconductor device of claim 12, wherein the timing profile controller is coupled to the address detector and configured to determine a timing profile for reading the target data based on a signal from the address detector, the signal indicating that the starting address of the target data is in the first address group.

14. The semiconductor device of claim 11, wherein the memory interface is configured to output the output signal after one or more dummy cycles following the input signal, and wherein the circuitry is configured to determine which group the starting address is in before the one or more dummy cycles start.

15. The semiconductor device of claim 11, wherein the memory interface comprises a serial pin configured to perform at least one of:

receiving the input signal from a bus, or outputting the output signal to the bus.

16. The semiconductor device of claim 11, wherein the memory interface comprises multiple serial input/output (SIO) pins, and the memory interface is configured to receive the input signal from a bus using at least one of the multiple SIO pins and output the output signal to the bus using the multiple SIO pins.

17. The semiconductor device of claim 1, wherein the read instruction comprises a read command and the starting address.

18. A system, comprising:

a memory device; and a controller coupled to the memory device and configured to transmit a read instruction to the memory device, wherein the memory device comprises:

a memory cell array comprising a plurality of memory cells configured to store data; and a circuitry coupled to the memory cell array and configured to read stored data from the memory cell array, wherein the circuitry comprises a timing profile controller and a sense amplifier, wherein the circuitry is configured to:

obtain a starting address of target data to be read based on the read instruction;

determine that the starting address is in a first address group of a plurality of address groups, wherein each of the plurality of address groups is associated with a respective reading speed, and wherein the plurality of address groups correspond to one or more read regions of the memory cell array;

configure, by the timing profile controller, a first timing profile for the first address group, the first timing profile being associated with a first reading speed for the first address group;

receive, by the sense amplifier, the first timing profile transmitted from the timing profile controller, and read out, by the sense amplifier, the target data from the memory cell array according to the first timing profile that is configured based on the starting address being in the first address group; and output the read out target data to the controller.

19. The system of claim 18, wherein the target data comprises a first part and a second part sequential to the first part, the first part having the starting address, and wherein the circuitry is configured to read out the first part with the first reading speed and the second part with a second reading speed that is higher than the first reading speed.

20. A method, comprising:

obtaining a starting address of target data to be read from a memory cell array comprising a plurality of memory cells;

determining that the starting address is in a first address group of a plurality of address groups, wherein each of the plurality of address groups is associated with a respective reading speed, and the first address group is associated with a first reading speed, and wherein the plurality of address groups correspond to one or more read regions of the memory cell array;

configuring, by a timing profile controller, a first timing profile for the first address group, the first timing profile being associated with the first reading speed for the first address group;

receiving, by a sense amplifier, the first timing profile transmitted from the timing profile controller; and reading out, by the sense amplifier, the target data from the memory cell array with the first reading speed according to the first timing profile that is configured based on the starting address being in the first address group.

* * * * *